(12) United States Patent
Kim et al.

(10) Patent No.: US 10,437,947 B2
(45) Date of Patent: Oct. 8, 2019

(54) METHOD AND SYSTEM FOR PROVIDING VIRTUAL SEMICONDUCTOR PRODUCT REPLICATING REAL SEMICONDUCTOR PRODUCT

(71) Applicant: SK HOLDINGS CO., LTD., Seoul (KR)

(72) Inventors: So Dam Kim, Seongnam-si (KR); Yong Sik Moon, Seongnam-si (KR)

(73) Assignee: SK HOLDINGS CO., LTD., Seoul (KR)

( * ) Notice: Subject to any disclaimer, the term of this patent is extended or adjusted under 35 U.S.C. 154(b) by 0 days.

(21) Appl. No.: 15/704,064

(22) Filed: Sep. 14, 2017

(65) Prior Publication Data

US 2018/0357339 A1 Dec. 13, 2018

(30) Foreign Application Priority Data

Jun. 12, 2017 (KR) .................... 10-2017-0073022

(51) Int. Cl.
*G06F 9/455* (2018.01)
*G06F 17/50* (2006.01)

(52) U.S. Cl.
CPC ...... *G06F 17/5009* (2013.01); *G06F 17/5081* (2013.01)

(58) Field of Classification Search
USPC .............................. 716/51, 53, 54, 132, 138
See application file for complete search history.

(56) References Cited

U.S. PATENT DOCUMENTS

| 9,711,989 B2 * | 7/2017 | Shin ................... H02J 7/007 |
| 2005/0207081 A1 * | 9/2005 | Ying ................... H01H 9/32 361/105 |
| 2012/0228935 A1 * | 9/2012 | Nakashima .......... H02J 3/32 307/24 |

(Continued)

FOREIGN PATENT DOCUMENTS

| JP | 2016-512641 A | 4/2016 |
| KR | 10-2014-0033463 A | 3/2014 |

OTHER PUBLICATIONS

Communication dated Nov. 19, 2018, issued by the Intellectual Property Office of Taiwan in counterpart Taiwanese Patent Application No. 106132082.

(Continued)

*Primary Examiner* — Brian Ngo
(74) *Attorney, Agent, or Firm* — Sughrue Mion, PLLC

(57) ABSTRACT

A method and a system for providing a virtual semiconductor product replicating a real semiconductor product are provided. The method for providing the virtual semiconductor product according to an exemplary embodiment of the present disclosure includes: obtaining data which is used for manufacturing a real semiconductor; virtually producing a semiconductor product using the obtained manufacturing data; and providing the virtually produced virtual semiconductor product. Accordingly, the virtual semiconductor product replicating the real semiconductor product is provided in real time with real processing steps, such that time and expense required to measure and examine a semiconductor product can be minimized and a delay in producing semiconductor products is not caused.

8 Claims, 4 Drawing Sheets

(56) References Cited

U.S. PATENT DOCUMENTS

2013/0147421 A1* 6/2013 Shin .................. H02J 7/007
                                                320/101
2014/0282324 A1 9/2014 Greiner et al.
2017/0109646 A1 4/2017 David

OTHER PUBLICATIONS

Communication dated Jul. 20, 2018, issued by the Korean Patent Office in counterpart Korean Application No. 10-2017-0073022.

* cited by examiner

METHOD AND SYSTEM FOR PROVIDING VIRTUAL SEMICONDUCTOR PRODUCT REPLICATING REAL SEMICONDUCTOR PRODUCT

CROSS-REFERENCE TO RELATED APPLICATION(S) AND CLAIM OF PRIORITY

The present application claims the benefit under 35 U.S.C. § 119(a) to a Korean patent application filed in the Korean Intellectual Property Office on Jun. 12, 2017, and assigned Serial No. 10-2017-0073022, the entire disclosure of which is hereby incorporated by reference.

TECHNICAL FIELD OF THE INVENTION

The present disclosure relates generally to semiconductor manufacturing technology, and more particularly, to a method and a system for monitoring a semiconductor manufacturing process in order to detect a defect and predict a yield.

BACKGROUND OF THE INVENTION

Measurement performed to detect a defect and predict a yield during a semiconductor manufacturing process may be performed using scanning electron microscope (SEM), transmission electron microscope (TEM), or the like. However, measurement/examination requires long time and high expense and may cause a delay in production.

In addition, in measuring and examining using SEM/TEM, it is impossible to perform a process for a more exact examination on an intermediate product (for example, cutting) or a process for a yield improvement test. This is because the process for this results in abandonment of final manufacturing of the intermediate product.

SUMMARY OF THE INVENTION

To address the above-discussed deficiencies of the prior art, it is a primary aspect of the present disclosure to provide a method and a system for providing a virtual semiconductor product replicating a real semiconductor product, which can minimize time and expense required to perform measurement/examination, do not cause a delay in production, and enables processes for an examination and a test.

According to one aspect of the present disclosure, a method for providing a virtual semiconductor product includes: obtaining data which is used for manufacturing a real semiconductor; virtually producing a semiconductor product using the obtained manufacturing data; and providing the virtually produced virtual semiconductor product.

The obtaining, the producing, and the providing may be performed in real time in association with real semiconductor processing steps.

The manufacturing data may include process-related data and equipment-related data.

The method may further include: virtually measuring the virtual semiconductor product; and providing the virtual measurement data.

The method may further include: processing the virtual semiconductor product according to a user command; and providing the processed virtual semiconductor product.

The processing may include processing to examine the virtual semiconductor product or to perform a test necessary for improving a yield.

The method may further include: virtually detecting a defect from the virtual semiconductor product; and providing the detected virtual defect information.

The method may further include: predicting a yield by analyzing the virtual semiconductor product; and providing the predicted yield information.

The method may further include: obtaining measurement data regarding a real semiconductor product; and correcting the virtual semiconductor product using the obtained measurement data.

According to another aspect of the present disclosure, a system for generating a virtual semiconductor product includes: an obtaining unit configured to obtain data which is used for manufacturing a real semiconductor; and a processor configured to virtually produce a semiconductor product using the obtained manufacturing data, and provide the virtually produced virtual semiconductor product.

According to exemplary embodiments of the present disclosure as described above, the virtual semiconductor product replicating the real semiconductor product is provided in real time with real processing steps, such that time and expense required to measure and examine a semiconductor product can be minimized and a delay in producing semiconductor products is not caused.

In addition, according to embodiments of the present disclosure, since not only the exterior of the semiconductor product but also the inner structure thereof can be freely observed in three dimensions, the number of times of complicated examinations can be reduced.

Furthermore, according to embodiments of the present disclosure, since a process for an examination and a test (for example, cutting) can be virtually performed, a more exact examination or assumed test for an intermediate product is enabled without abandoning final manufacturing of the intermediate product, and thus a yield can be improved.

Other aspects, advantages, and salient features of the invention will become apparent to those skilled in the art from the following detailed description, which, taken in conjunction with the annexed drawings, discloses exemplary embodiments of the invention.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

Hereinafter, the present disclosure will be described in detail with reference to the accompanying drawings.

Figure 1:
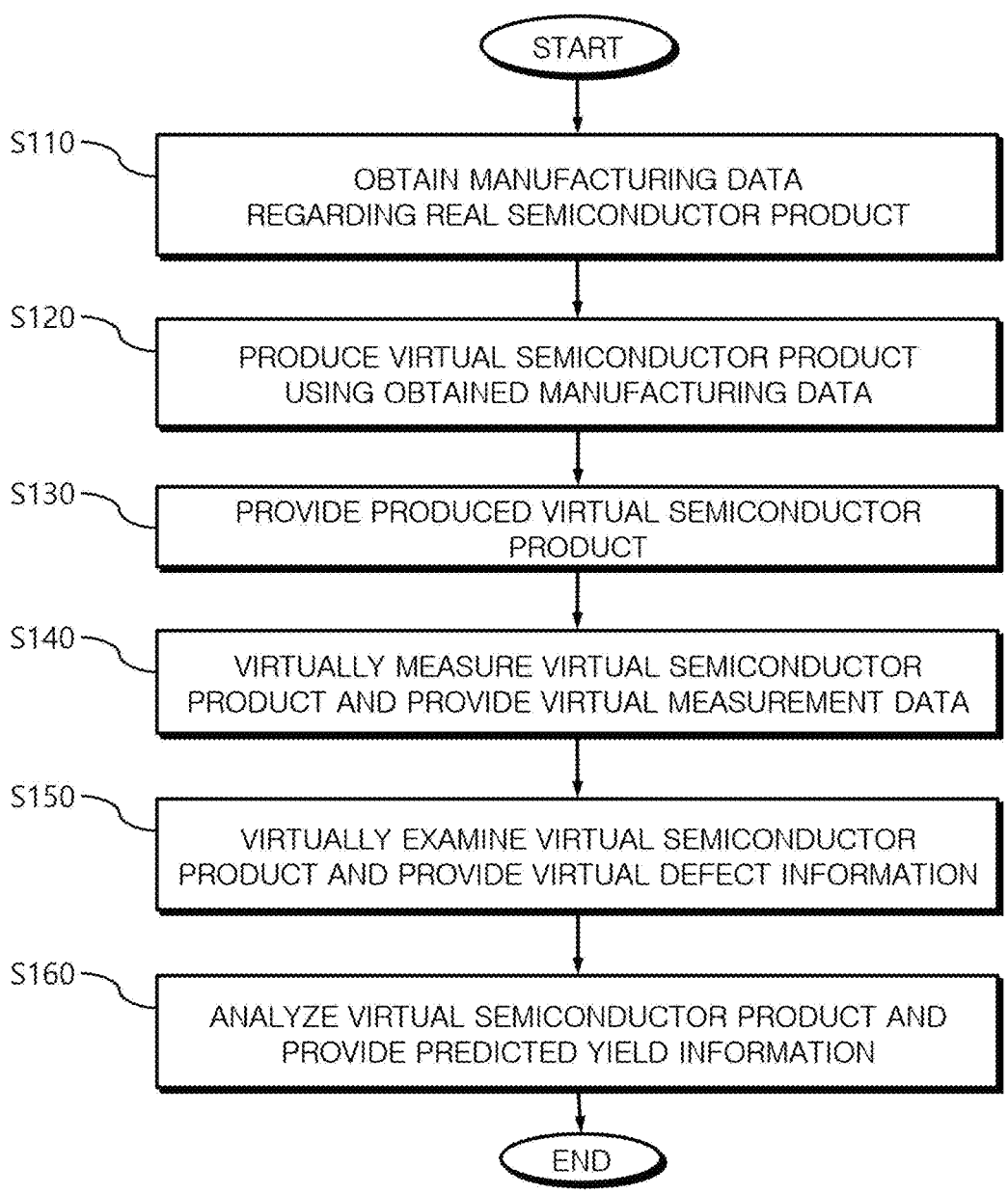
FIG. 1 is a flowchart provided to explain a method for providing a virtual semiconductor product according to an exemplary embodiment of the present disclosure.

FIG. 1 is a flowchart provided to explain a method for providing a virtual semiconductor product according to an exemplary embodiment of the present disclosure. The method for providing a virtual semiconductor product according to an exemplary embodiment generates and provides a virtual semiconductor product replicating a real semiconductor product.

The method illustrated in FIG. 1 may be performed by a "virtual semiconductor product generation system," which is a kind of a computing system, and more specifically, may be performed by a "virtual semiconductor generation tool," which is a simulation tool executed in the virtual semiconductor product generation system to virtually produce a semiconductor product.

As shown in FIG. 1, the virtual semiconductor product generation system obtains data used for manufacturing a real semiconductor, first (S110). The manufacturing data obtained in step S110 may include process-related data and equipment-related data.

The process-related data may include parameters describing a process type and a processing condition, and the equipment-related data may include an equipment type, specifications, a state, a driving condition, or the like.

Next, the virtual semiconductor product generation system virtually manufactures and produces a semiconductor according to the manufacturing data obtained in step S110 (S120). In step S120, the virtual semiconductor product may be produced in the form of a three-dimensional (3D) image.

There is a difference between the real product and the virtual product, but the virtual semiconductor product produced in step S120 is produced under the same condition as a real semiconductor product and thus is relatively identical to the real semiconductor product.

Thereafter, the virtual semiconductor product generation system provides the virtual semiconductor product produced in step S120 to a semiconductor manufacture manager (S130). Since the virtual semiconductor product produced in step S120 is the 3D image, the virtual semiconductor product may be provided by displaying the 3D image in step S130.

While observing the virtual semiconductor product provided in the form of the 3D image in step S130, the semiconductor manufacture manager may predict not only an exterior of the real semiconductor product but also an inner structure of the real semiconductor product.

Next, the virtual semiconductor product generation system may virtually measure the virtual semiconductor product produced in step S120, and may provide virtual measurement data to the semiconductor manufacture manager (S140).

By doing so, the semiconductor manufacture manager can quickly receive the measurement result without actually measuring the real semiconductor products, and can determine whether to perform the actual measurement based on the results.

Furthermore, the virtual semiconductor product generation system may virtually examine the virtual semiconductor product produced in step S120, and virtually detect a defect from the virtual semiconductor product and provide the detected virtual defect information to the semiconductor manufacture manager (S150).

In addition, the virtual semiconductor product generation system may predict a yield by analyzing the virtual semiconductor product produced in step S120, and may provide the predicted yield information to the semiconductor manufacture manager (S160).

Through steps S150 and S160, the semiconductor manufacture manager can predict a defect and a yield regarding the real semiconductor product.

Figure 2:
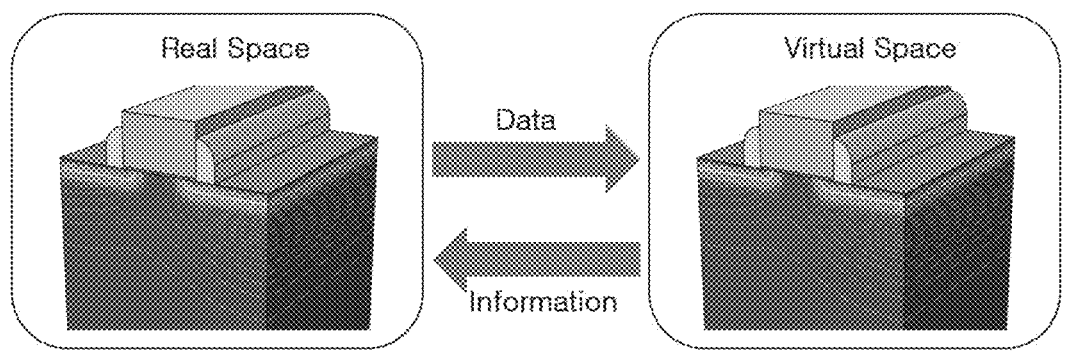
FIG. 2 is a view conceptually showing generation of a virtual semiconductor product replicating a real semiconductor product.

FIG. 2 illustrates a real semiconductor product and a virtual semiconductor product replicating the same. In FIG. 2, the semiconductor product illustrated in the left is actually manufactured, and the semiconductor product shown on the right is a product replicating the real semiconductor in a virtual environment.

In FIG. 2, the virtual semiconductor product is replicated in accordance with manufacturing data for a real semiconductor product, and various meaningful information (virtual measurement information, virtual examination information, yield prediction information, or the like) obtained from the virtual semiconductor product is provided to be referenced in a subsequence manufacturing process of the real semiconductor product.

Up to now, the method for generating and providing the virtual semiconductor product replicating the real semiconductor product has been described with reference to a preferred embodiment.

In the above-described embodiment, the virtual measurement step S140, the virtual examination step S150, and the yield prediction step S160 may be selectively performed, and the determination whether to perform these step may be made by the semiconductor manufacturing manager.

In addition, the step of obtaining the real semiconductor manufacturing data (S110), the step of producing the virtual semiconductor product (S120), and the step of providing the virtual semiconductor product (S130) may be performed in real time in association with real semiconductor manufacturing steps.

The virtual measurement step S140, the virtual examination step S150, and the yield prediction step S160 may be performed in a virtual region. Therefore, when the semiconductor manufacture manager determines to perform these steps in advance, these steps may be performed in real time without a delay after the real semiconductor manufacturing steps are completed.

Figure 3:
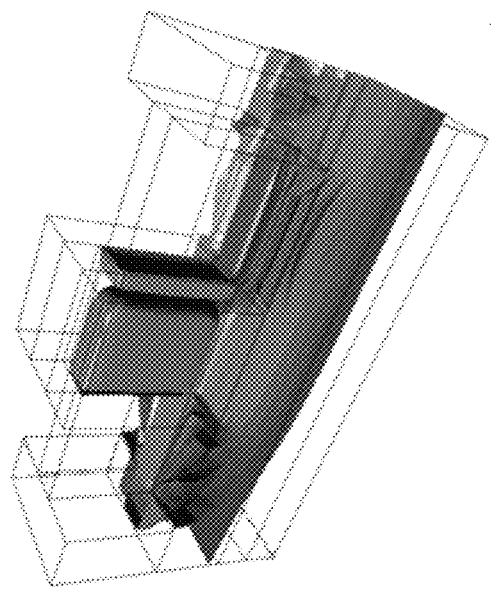
FIG. 3 is a view conceptually showing comparison and analysis of an ideal semiconductor product and a virtual semiconductor product.
Figure 3:
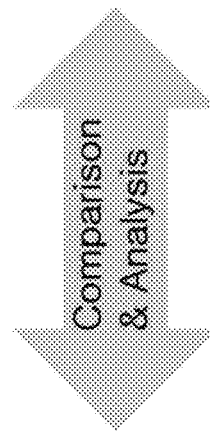
Figure 3:
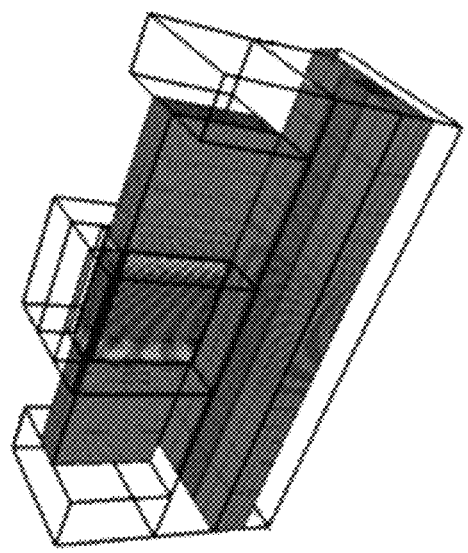

Meanwhile, in order to compare the virtual semiconductor product produced in step S120 and an ideal semiconductor product designed using a simulation tool in an R&D process, the virtual semiconductor product generation system may provide both products in the form of a 3D image as shown in FIG. 3. Furthermore, the virtual semiconductor product generation system may also provide information obtained by comparing and analyzing both products.

In addition, the virtual semiconductor product generation system may process the virtual semiconductor product generated in step S120 for the purpose of testing necessary for the examination or improvement of the yield, thereby providing a processed virtual semiconductor product is possible.

Processing details may be determined by the semiconductor manufacture manager, and processing may be performed according to pre-defined processing details.

Meanwhile, real measurement may be performed regarding the real semiconductor product. In this case, the virtual semiconductor product generation system may obtain real measurement data regarding the real semiconductor product, and may correct a structure/material of the virtual semiconductor product using the real measurement data.

This process corresponds to a procedure for offsetting the difference between the virtual semiconductor product and the real semiconductor product, and it is impossible to correct when real measurement is not performed regarding the real semiconductor product.

Figure 4:
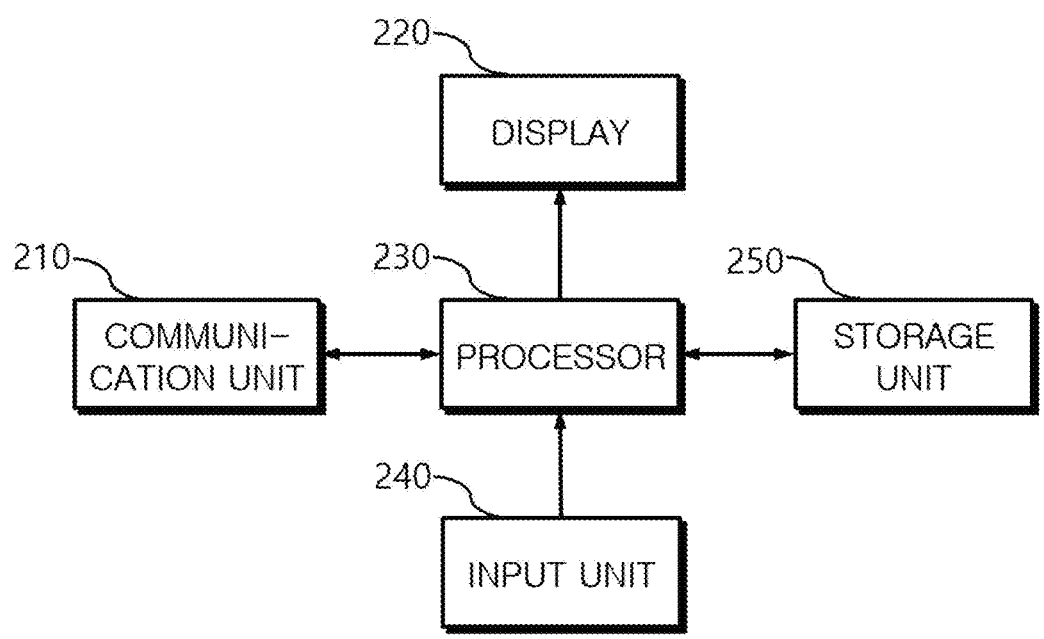
FIG. 4 is a block diagram showing a system for generating a virtual semiconductor product according to another embodiment of the present disclosure.

Hereinafter, a virtual semiconductor product generation system which can perform a method for providing a virtual semiconductor product according to an exemplary embodiment will be described in detail with reference to FIG. 4. FIG. 4 is a block diagram of a virtual semiconductor product generation system according to another embodiment of the present disclosure.

The virtual semiconductor product generation system according to an exemplary embodiment of the present disclosure may include a communication unit 210, a display 220, a processor 230, an input unit 240, and a storage unit 250 as shown in FIG. 4.

The communication unit 210 is a means for data communication by connecting with an external device or an external network, and obtain manufacturing data and measurement data for a real semiconductor product.

The display 220 is a means for displaying information and displays a virtual semiconductor product, virtual measurement data, virtual defect information, yield information, or the like. The input unit 240 is means for inputting information and is used to input the manufacturing data and the measurement data regarding the real semiconductor product and/or input manager setting items.

The display 220 and the input unit 240 may be integrated into a touch screen. The integrated touch screen is more useful when the virtual semiconductor product generation system is of a mobile type.

Since the manufacturing data and the measurement data regarding the real semiconductor product described above may be received from processing/measuring equipment or a network through the communication unit 210, or may be received and collected through the input unit 240, the communication unit 210 and the input unit 240 may serve as a data obtaining means.

The processor 230 may perform the virtual semiconductor product generation/provision algorithm illustrated in FIG. 1 using the obtained data, and may display the result of performing on the display 220 or transmit the result to the external device/network through the communication unit 210.

The storage unit 250 provides a storage space necessary for performing the virtual semiconductor product generation/provision algorithm.

The technical idea of the present disclosure may be applied to a computer-readable recording medium which has a computer program recorded thereon, for performing the functions of the apparatus and the method according to the present embodiments. In addition, the technical idea according to various embodiments of the present disclosure may be implemented in the form of a computer-readable code recorded on a computer-readable recording medium. The computer-readable recording medium may be any data storage device that can be read by a computer and can store data. For example, the computer-readable recording medium may include a ROM, a RAM, a CD-ROM, a magnetic tape, a floppy disk, an optical disk, a hard disk drive, or the like. In addition, a computer-readable code or program stored in the computer-readable recording medium may be transmitted through a network connected between computers.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for providing a virtual semiconductor product, the method comprising:
   obtaining manufacturing data which is used for manufacturing a real semiconductor, wherein the manufacturing data includes process-related data and equipment-related data, and the process-related data includes parameters describing a process type and a processing condition, and the equipment-related data includes a type of an equipment for manufacturing the real semiconductor, specifications of the equipment and a driving condition of the equipment;
   virtually producing a semiconductor product using the obtained manufacturing data including the process-related data and the equipment-related data; and
   providing the virtually produced semiconductor product, wherein the virtually producing the semiconductor product comprises:
   obtaining real measurement data regarding the real semiconductor, and
   correcting the virtually produced semiconductor product using the obtained real measurement data regarding the real semiconductor, and
   wherein the providing comprises displaying both the virtually produced semiconductor product and an ideal semiconductor product corresponding to the virtually produced semiconductor product and designed using a simulation tool on a display in a form of a three dimensional (3D) image.

2. The method of claim 1, wherein the obtaining, the producing, and the providing are performed in real time in association with real semiconductor processing steps.

3. The method of claim 1, further comprising:
   virtually measuring the virtually produced semiconductor product; and
   displaying the virtual measurement data on the display.

4. The method of claim 1, further comprising:
   processing the virtually produced semiconductor product according to a user command; and
   providing the processed virtual semiconductor product.

5. The method of claim 4, wherein the processing comprises processing to examine the virtually produced semiconductor product or to perform a test necessary for improving a yield.

6. The method of claim 1, further comprising:
   virtually detecting a defect from the virtually produced semiconductor product; and
   providing the detected virtual defect information.

7. The method of claim 1, further comprising:
   predicting a yield by analyzing the virtually produced semiconductor product; and
   providing the predicted yield information.

8. A system for generating a virtual semiconductor product, comprising:
   a display;
   an obtaining unit configured to obtain manufacturing data which is used for manufacturing a real semiconductor; and
   a processor configured to virtually produce a semiconductor product using the obtained manufacturing data, and provide the virtually produced semiconductor product,
   wherein the manufacturing data includes process-related data and equipment-related data, and the process-related data includes parameters describing a process type and a processing condition, and the equipment-related data includes a type of an equipment for manufacturing the real semiconductor, specifications of the equipment and a driving condition of the equipment, and
   wherein the processor is configured to obtain real measurement data regarding the real semiconductor, correct the virtually produced semiconductor product using the obtained real measurement data regarding the real semiconductor, and display both the virtually produced semiconductor product and an ideal semiconductor product corresponding to the virtually produced semiconductor product and designed using a simulation tool on the display in a form of a three dimensional (3D) image.

* * * * *